(12) United States Patent
Guo

(10) Patent No.: US 12,495,695 B2
(45) Date of Patent: Dec. 9, 2025

(54) OLED DISPLAY PANEL AND LASER REPAIR METHOD THEREOF

(71) Applicant: Wuhan China Star Optoelectronics Semiconductor Display Technology Co., Ltd., Hubei (CN)

(72) Inventor: Wanghui Guo, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/922,385

(22) PCT Filed: Jan. 7, 2022

(86) PCT No.: PCT/CN2022/070673
§ 371 (c)(1),
(2) Date: Oct. 31, 2022

(87) PCT Pub. No.: WO2023/115655
PCT Pub. Date: Jun. 29, 2023

(65) Prior Publication Data
US 2024/0224690 A1    Jul. 4, 2024

(30) Foreign Application Priority Data
Dec. 23, 2021    (CN) .......................... 202111590346.8

(51) Int. Cl.
*H10K 59/38*    (2023.01)
*H10K 59/35*    (2023.01)
*H10K 71/00*    (2023.01)

(52) U.S. Cl.
CPC ............. *H10K 59/38* (2023.02); *H10K 59/35* (2023.02); *H10K 71/861* (2023.02)

(58) Field of Classification Search
CPC ...... H10K 50/865; H10K 59/00; H10K 71/00; B23K 26/00
See application file for complete search history.

(56) References Cited

U.S. PATENT DOCUMENTS

2014/0042424 A1    2/2014  Yamakita
2021/0288116 A1*   9/2021  Xu ....................... H10K 50/865

FOREIGN PATENT DOCUMENTS

CN    109212791    1/2019
CN    109841763    6/2019
(Continued)

OTHER PUBLICATIONS

International Search Report and the Written Opinion Dated Sep. 28, 2022 From the International Searching Authority Re. Application No. PCT/CN2022/070673 and Its Translaton Into English. (17 Pages).
(Continued)

*Primary Examiner* — Fernando L Toledo
*Assistant Examiner* — Adam S Bowen

(57) ABSTRACT

The present application provides an organic light-emitting diode (OLED) display panel and a laser repair method. The OLED display panel includes color filters with the light transmission rates of greater than 90% for laser light with a wavelength range of 900 nm to 1200 nm, and includes at least one light-emitting pattern containing carbon black. The laser repair method increases the light transmission rates of the filter patterns for the laser light with the wavelength range of 900 nm to 1200 nm, so a laser repair yield is increased.

18 Claims, 3 Drawing Sheets

(56) References Cited

FOREIGN PATENT DOCUMENTS

| | | |
|---|---|---|
| CN | 112992971 | 6/2021 |
| CN | 113745297 | 12/2021 |
| JP | 2002-341304 | 11/2002 |
| JP | 2003-233329 | 8/2003 |
| JP | 2008-235178 | 10/2008 |
| KR | 10-1753276 | 7/2017 |

OTHER PUBLICATIONS

Notification of Office Action and Search Report Dated Jul. 9, 2024 From The State Intellectual Property Office of the People's Republic of China Re. Application No. 202111590346.8 and Its Translation Into English. (18 Pages).

* cited by examiner

OLED DISPLAY PANEL AND LASER REPAIR METHOD THEREOF

RELATED APPLICATIONS

This application is a National Phase of PCT Patent Application No. PCT/CN2022/070673 having International filing date of Jan. 7, 2022, which claims the benefit of priority of Chinese Patent Application No. 202111590346.8 filed on Dec. 23, 2021. The contents of the above applications are all incorporated by reference as if fully set forth herein in their entirety.

FIELD AND BACKGROUND OF THE INVENTION

The present invention relates to a field of organic light-emitting diode (OLED) display technology and in particular, to an OLED display panel and a laser repair method thereof.

Laser repairing a bright spot of a screen is to eliminate the bright spot and other defects of the screen by irradiating a light-emitting material of a light-emitting layer with a light of a fixed wavelength to make the light-emitting material fail.

In practice, in a modular panel manufacturing process, products with some defects need to be repaired by laser light irradiated on a pixel area so as to improve production yields. However, color filter film layers in depolarizer organic light-emitting diode (OLED) products will reduce a laser light transmission rate, resulting in low laser repair yields.

Therefore, conventional OLED display panels have a technical problem of low laser repair yields.

SUMMARY OF THE INVENTION

The present application provides an organic light-emitting diode (OLED) display panel and a laser repair method for the OLED display panel, which can alleviate a technical problem of low laser repair yields in conventional OLED display panels.

The present application provides an organic light-emitting diode (OLED) display panel, comprising:
  a substrate;
  an array layer disposed on the substrate;
  a light-emitting functional layer disposed above the array layer and comprising a plurality of light-emitting patterns;
  a color filter layer comprising a plurality of filter patterns and a plurality of black matrixes spaced from each other, wherein each filter pattern is arranged in alignment with one of the light-emitting patterns;
  wherein at least one of the light-emitting patterns comprises a carbonized light-emitting material, the carbonized light-emitting material comprises at least carbon black, and a carbon content of the carbonized light-emitting material is greater than 50%.

Optionally, in some embodiments of the present application, a light transmission rate of each filter pattern is greater than 90% for laser light having a wavelength range from 900 nanometers (nm) to 1200 nm.

Optionally, in some embodiments of the present application, a light transmission rate of each filter pattern has greater than 95% for the laser light having the wavelength range from 1000 nm to 1100 nm.

Optionally, in some embodiments of the present application, any two of the first filter pattern, the second filter pattern, and the third filter pattern have a light transmission rate difference $\Delta T$ of less than 20% for the laser light having the wavelength range from 760 nm to 1200 nm.

Optionally, in some embodiments of the present application, any two of the first filter pattern, the second filter pattern, and the third filter pattern have a laser transmission difference $\Delta T$ of less than 5% for the laser light having the wavelength range from 1000 nm to 1100 nm.

Optionally, in some embodiments of the present application, a full width at half maximum (FWHM) of the third filter pattern for a laser transmission spectrum from 430 nm to 760 nm is greater than the FWHM of the second filter pattern for the laser transmission spectrum from 430 nm to 760 nm.

Optionally, in some embodiments of the present application, when the wavelength range of the laser light is from 510 nm to 550 nm, the light transmission rate of the second filter pattern ranges from 60% to 80%.

Optionally, in some embodiments of the present application, a peak value corresponding to the second filter pattern is 527 nm in the laser transmission spectrum from 510 nm to 550 nm, and the FWHM corresponding to the second filter pattern is 80 nm in the laser transmission spectrum from 510 nm to 550 nm.

Optionally, in some embodiments of the present application, when the laser light has the wavelength range from 430 nm to 470 nm, the light transmission rate of the third filter pattern ranges from 60% to 80%.

Optionally, in some embodiments of the present application, the peak value corresponding to the third filter pattern is 460 nm in the laser transmission spectrum from 430 nm to 470 nm, and the FWHM corresponding to the third filter pattern is 90 nm in the laser transmission spectrum from 430 nm to 470 nm.

Optionally, in some embodiments of the present application, when the laser light has the wavelength range from 647 nm to 760 nm, the light transmission rate of the first filter pattern ranges from 60% to 80%.

Optionally, in some embodiments of the present application, the light transmission rate of each filter pattern for the laser light having the wavelength range of 900 nm to 1200 nm is greater than the light transmission rate of each filter pattern for the laser light having the peak wavelength of 430 nm to 760 nm.

Optionally, in some embodiments of the present application, the color filter layer comprises a first filter pattern, a second filter pattern, and a third filter pattern, the light-emitting functional layer comprises a red light-emitting pattern, a green light-emitting pattern, and a blue light-emitting pattern, the first filter pattern and the red light-emitting pattern are arranged in alignment, the second filter pattern and the green light-emitting pattern are arranged in alignment, the third filter pattern and the blue light-emitting pattern are arranged in alignment.

Optionally, in some embodiments of the present application, the first filter pattern has a greater light transmission rate for red light than for the blue light and green light, the second filter pattern has a greater light transmission rate for the green light than for the red light and the blue light, and the third filter pattern has a greater light transmission rate for the blue light than for the red light and the green light.

Optionally, in some embodiments of the present application, the first filter pattern, the second filter pattern, and the third filter pattern have different film thicknesses.

Optionally, in some embodiments of the present application, the OLED display panel comprises a display region and a non-display region, the non-display region is provided with an organic groove, the organic groove passes through at least the array layer.

Optionally, in some embodiments of the present application, the organic groove is filled with an organic material.

Optionally, in some embodiments of the present application, the organic material in the organic groove is same as a material of a planarization layer.

The present application provides a laser repair method for an organic light-emitting diode (OLED) display panel, comprising:

providing an OLED display panel to be repaired, wherein the OLED display panel to be repaired comprises a light-emitting functional layer and a color filter disposed corresponding to the light-emitting functional layer, and the color filter comprises a plurality of filter patterns; and performing laser irradiation on a bright spot of the light-emitting functional layer through the filter patterns to laser repair the bright spot, wherein a light transmission rate of each filter pattern is greater than 90% for laser light having a wavelength range from 900 nanometers (nm) to 1200 nm.

Optionally, in some embodiments of the present application, in the step of performing laser irradiation on a bright spot of the light-emitting functional layer through the filter patterns, the laser light has the wavelength range from 1000 nm to 1100 nm, and each filter pattern has the light transmission rate of greater than 95% for the laser light having the wavelength range from 1000 nm to 1100 nm.

Advantages of the Present Application

The OLED display panel of the present application comprises the color filter layer with the light transmission rate of greater than 90% for the laser light with the wavelength range of 900 nm to 1200 nm, and the light-emitting functional layer comprises at least one light-emitting pattern containing carbon black. The laser repair method repairs the bright spots of the light-emitting functional layer by the laser light with the wavelength range of 900 nm to 1200 nm passing through the filter patterns, so that the light-emitting material at the bright spot is turned into a light-emitting material containing carbon black. By increasing the light transmission rate of the filter pattern for the laser light having the wavelength range of 900 nm to 1200 nm, the laser repair method has an increased laser repair yield.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DESCRIPTION FOR REFERENCE NUMERAL

Figure 1:
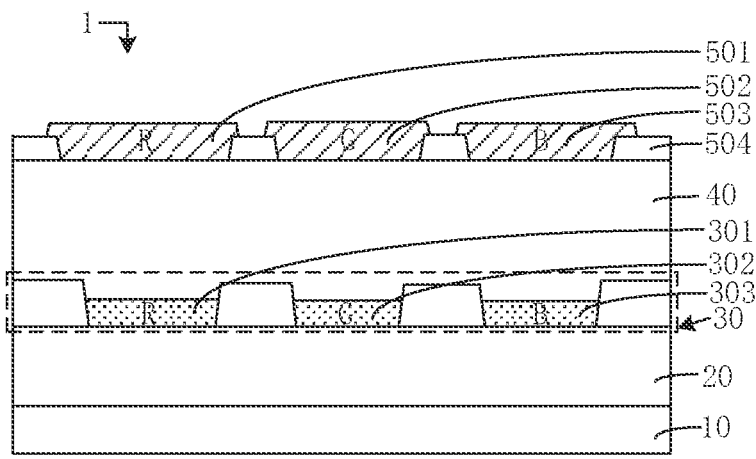
FIG. 1 is a schematic cross-sectional view of an organic light-emitting diode (OLED) display panel according to the present application.

| Reference numeral | Part name | Reference numeral | Part name |
| --- | --- | --- | --- |
| 1 | OLED display panel | 10 | substrate |
| 20 | array layer | 30 | light-emitting functional layer |
| 40 | encapsulation layer | 50 | color filter layer |
| 60 | optical adhesive layer | 70 | cover |
| 2 | laser light source | 101 | first flexible substrate layer |
| 102 | rigid substrate layer | 103 | second flexible substrate layer |
| 301 | red light-emitting pattern | 302 | Green light-emitting pattern |
| 303 | blue light-emitting layer | 501 | red filter pattern |
| 502 | green filter pattern | 503 | blue filter pattern |
| 504 | black matrix | 201 | light shielding layer |
| 202 | buffer layer | 203 | active layer |
| 204 | gate insulating layer | 205 | gate layer |
| 206 | interlayer insulating layer | 207 | source/drain layer |
| 2041 | first gate insulating layer | 2042 | second gate insulating layer |
| 2051 | first gate layer | 2052 | second gate layer |
| 2071 | source | 2072 | drain |
| 80 | non-display region | 90 | display region |
| 3 | array substrate | | |

DESCRIPTION OF SPECIFIC EMBODIMENTS OF THE INVENTION

The technical solutions in the present application will be clearly and completely described below in conjunction with accompanying drawings and with reference to specific embodiments. Obviously, the embodiments are only some of the embodiments of the present application, rather than all the embodiments. Based on the embodiments in the present application, all other embodiments obtained by those skilled in the art without creative work shall fall within the protection scope of the present application. In addition, it should be understood that the specific embodiments described here are only used to illustrate and explain the present application, and are not used to limit the present application. In the present application, unless otherwise specified, directional terms such as "upper" and "lower" generally refer to the upper and lower directions of a device in actual use or work state, and specifically refer to the directions in the drawings. The terms "inner" and "outer" are referred to with reference to outlines of the device.

In conventional organic light-emitting diode (OLED) display panels, depolarizer technology is realized by arranging a color filter layer on a light-emitting side of the light-emitting functional layer. When the OLED display panel has abnormalities such as bright spots on the screen, laser repair technology is usually used to repair the abnormal bright spots. However, due to a low light transmission rate of the color filter layer for laser light, laser repair yields are low.

Conventional techniques usually use laser light with a wavelength range of 350 nm to 550 nm for repair. However, if the light transmission rate in this wavelength range is increased, normal display functions of the OLED display panel are affected, and a light filtering function of the color filter layer fails.

The color filter layer comprises filter patterns corresponding to light-emitting patterns of different colors, and the laser light passes through the filter patterns to reach the light-emitting patterns, and then repairs abnormalities such as bright spots. When the filter patterns have low light transmission rates for the laser light, the laser repair yield is low. Therefore, there is an urgent need to provide a laser repair method that improves the laser repair yield.

Please refer to FIGS. 1 to 4. The present application provides an OLED display panel 1 and a laser repair method for the OLED display panel. The laser light is infrared light to repair the bright spots in the OLED display panel 1. By improving the light transmission rates of the filter patterns in the OLED display panel 1, the laser repair yield is improved.

A wavelength of the infrared light is at least greater than 760 nanometers (nm).

Further, in the present application, a wavelength range of the laser light is 900 nm to 1200 nm.

Referring to FIG. 1, the OLED display panel 1 of the present application comprises a substrate 10, an array layer 20, a light-emitting functional layer 30, an encapsulation layer 40, and a color filter layer 50. The array layer 20 is disposed on the substrate 10. The light-emitting functional layer 30 is disposed on the array layer 20, the light-emitting functional layer 30 comprises a plurality of light-emitting patterns, the encapsulation layer 40 is disposed on the light-emitting functional layer 30, and the color filter layer 50 is disposed on the encapsulation layer 40. The color filter layer 50 comprises a plurality of filter patterns and a plurality of black matrixes 504 spaced apart from each other. Each filter pattern is arranged in alignment with one of the light-emitting patterns. At least one of the light-emitting patterns comprises a carbonized light-emitting material, the carbonized light-emitting material comprises at least carbon black, and the carbonized light-emitting material has a carbon content greater than 50%.

When the wavelength range of the laser light is from 900 nm to 1200 nm, the filter pattern has a light transmission rate of more than 90% for the laser light having the wavelength range from 900 nm to 1200 nm. The bright spots in the light-emitting functional layer are all repaired to dark spots. The dark spots comprise the carbonized light-emitting material.

Preferably, when the wavelength range of the laser light is from 1000 nm to 1100 nm, the filter pattern has the light transmission rate of more than 95% for the laser light having the wavelength range from 1000 nm to 1100 nm.

Figure 2:
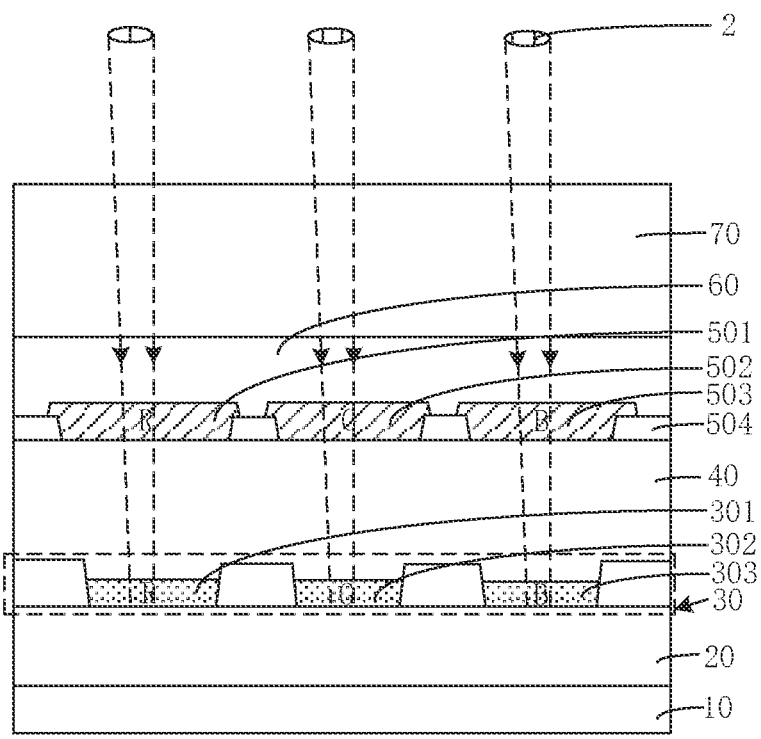
FIG. 2 is a schematic cross-sectional view of a laser repair method according to the present application.
Figure 3:
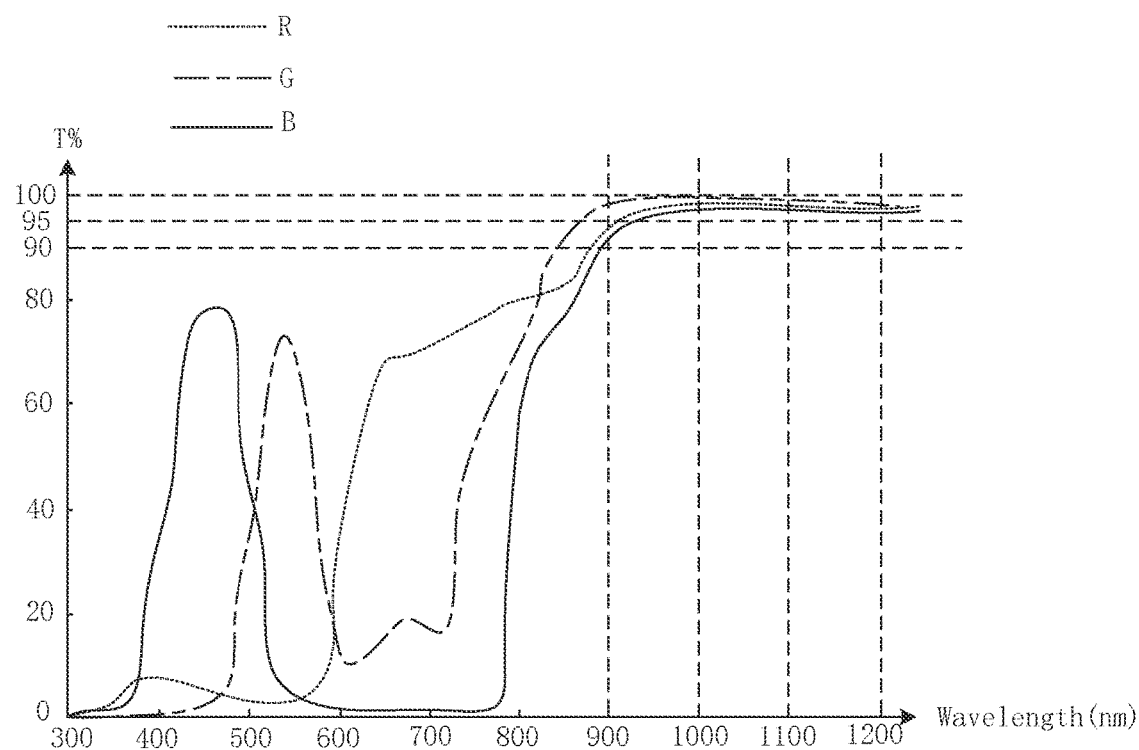
FIG. 3 is a schematic diagram showing a wavelength and a light transmission rate of a filter pattern of the OLED display panel according to the present application.

Please refer to FIGS. 2 and 3. The present application provides the laser repair method for the OLED display panel 1, comprising: repairing the bright spots in the light-emitting functional layer 30 by the laser light passing through the filter patterns. The wavelength range of the laser light is from 900 nm to 1200 nm, and the light transmission rate of the filter pattern needs to be greater than 90% in order to achieve a more efficient laser repair with a higher repair yield.

Specifically, the OLED display panel 1 comprises a color filter layer 50. The color filter layer 50 comprises a plurality of filter patterns and a plurality of black matrixes 504 spaced apart from each other. Each filter pattern is disposed between adjacent black matrixes 504, and the black matrixes 504 block laser light. Therefore, the laser light can only pass through the filter patterns to reach the light-emitting patterns below, and then repair the light-emitting patterns.

The filter pattern has a higher light transmission rate for the laser light with a wavelength range greater than 760 nanometers, and the light transmission rate is higher than the light transmission rate for the laser light with the wavelength range less than 760 nanometers.

Further, referring to FIG. 3, the laser light with the wavelength range from 1000 nanometers to 1100 nanometers can be used for repair, and the filter pattern has the light transmission rate of more than 95% for the laser light from 1000 nanometers to 1100 nanometers.

The present application is described in conjunction with specific embodiments.

Please refer to FIG. 1. The OLED display panel 1 of the present application includes a substrate 10, an array layer 20, a light-emitting functional layer 30, an encapsulation layer 40, and a color filter layer 50. The color filter layer 50 comprises a plurality of filter patterns. The filter pattern is made of a specific material, and the specific material needs to meet the following requirements: when a wavelength range of laser light is from 900 nm to 1200 nm, the filter pattern has a light transmission ratio of greater than 90% for the laser light with the wavelength range from 900 nm to 1200 nm.

In the present embodiment, a material of the color filter layer 50 of the OLED display panel 1 is improved to increase the light transmission rate for a specific wavelength range. In laser repair technology, by presetting the wavelength range of the laser light, the light transmission rate of the filter pattern can be increased for the laser light in the wavelength range, thereby improving laser repair effects.

Figure 4:
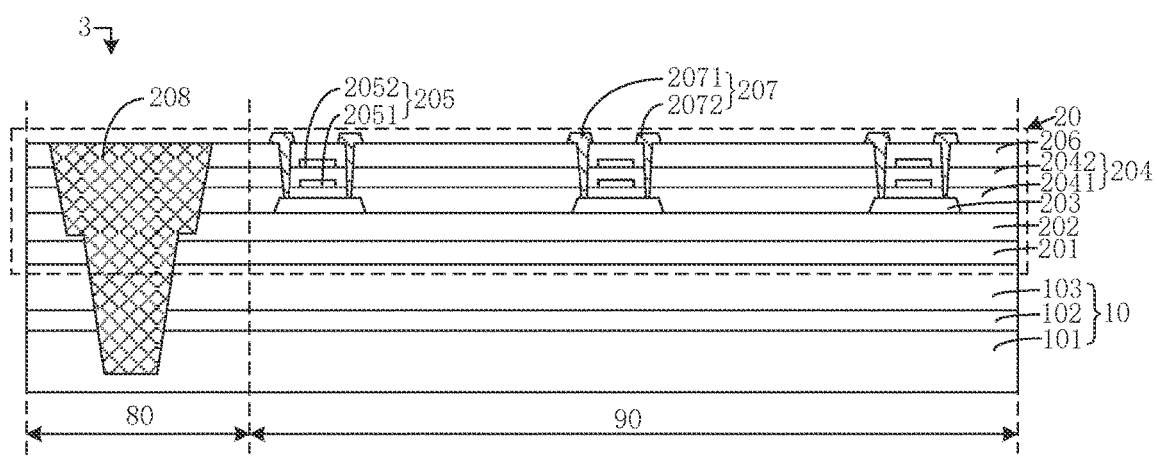
FIG. 4 is a schematic cross-sectional view of an array substrate of the OLED display panel according to the present application.

Please refer to FIG. 4. The OLED display panel 1 comprises an array substrate 3, and comprises a light-emitting functional layer 30 and an encapsulation layer 40 disposed above the array substrate 3. The array substrate 3 comprises a substrate 10 and an array layer 20 disposed on the substrate 10. The array layer 20 comprises a light-shielding layer 201, a buffer layer 202, an active layer 203, a gate insulating layer 204, a gate layer 205, and an interlayer insulating layer 206, and a source/drain layer 207 stacked on the substrate 10. The gate insulating layer 204 comprises a first gate insulating layer 2041 and a second gate insulating layer 2042. The gate layer 205 comprises a first gate layer 2051 and a second gate layer 2052. The source/drain layer 207 comprises a source 2071 and a drain 2072.

A planarization layer is also provided on the array layer 20.

The light-emitting functional layer 30 comprises an anode layer, a pixel definition layer, a light-emitting layer, and a cathode layer that are arranged above the planarization layer. The anode layer comprises a reflective layer and a transparent anode that are stacked on each other.

The encapsulation layer 40 can comprise a first inorganic layer, an organic layer, and a second inorganic layer stacked on the cathode layer.

It is understood that the encapsulation layer 40 is an inorganic-organic-inorganic laminated structure, which can better prevent moisture from entering the OLED display panel 1 from a side of the encapsulation layer 40, thereby improving the encapsulation effects. At the same time, by arranging the organic layer between the first inorganic layer and the second inorganic layer, the present application can buffer a bending stress. Therefore, the present application can prevent a problem that the first and second inorganic layers crack due to bending stress, which results in the inability to better block moisture intrusion.

It can be understood that, by configuring the gate layer 205 as the first gate layer 2051 and the second gate layer 2052, carrier mobility is increased. Further, the active layer 203 can be configured as the first active layer 203 and the second active layer 203, and doped regions of the first active layer 203 and the second active layer 203 are respectively connected to the source 2071 and the drain 2072 through via holes, and thereby further increasing the carrier mobility.

Referring to FIG. 4, it should be noted that, the OLED display panel 1 comprises a display region 90 and a non-display region 80. The non-display region 80 is provided with an organic groove that passes through at least the array layer 20. The organic groove is configured to buffer the bending stress of the non-display region 80 to prevent wiring above the organic groove from breaking. Further, the organic groove is filled with an organic material. By filling the organic groove with the organic material with stress buffering ability, the present application can further improve the stress buffering ability of the organic groove.

In one embodiment, the organic material in the organic groove is the same as a material of the planarization layer.

In the present embodiment, before producing the planarization layer, the organic groove is formed first. When the organic material is used to produce the planarization layer, the organic groove is filled with the organic material at the same time, which can reduce one manufacturing step of filling the organic material into the organic groove. Accordingly, a manufacturing process is simplified, and production costs are reduced.

Please refer to FIG. 4. In one embodiment, the organic groove also passes through a portion of the substrate 10. The substrate 10 comprises at least a first flexible substrate layer 101, a rigid substrate layer 102, and a second flexible substrate layer 103 sequentially stacked on each other. The light shielding layer 201 is disposed on the second flexible substrate layer 103.

The organic groove can be only extended through the second flexible substrate layer 103, which increases a depth of the organic groove and further improves the stress buffering effect of the organic groove.

The organic groove can also be extended through the second flexible substrate layer 103 and the rigid substrate layer 102.

It can be understood that the non-display region 80 comprises a bending area and a bonding area, the bending area is located between the bonding area and the display region 90, and the organic groove is usually arranged in the bending area to relieve a bending stress during a side bonding process to achieve a narrow bezel. When the bending area is bent, the bending stress is transmitted to the display region 90 along the rigid substrate layer 102, resulting in cracks in the display region 90 under stress. Therefore, the organic groove passing through the rigid substrate layer 102 can also block the bending stress from being transmitted the bending area or the bonding area to the display region 90, thus alleviating an impact of the bending stress in the display area 90.

In one embodiment, the filter pattern has the light transmission rate of more than 95% for the laser light from 1000 nm to 1100 nm.

The laser light can be used in laser repair technology to repair the defects like a bright spot in the OLED display panel 1, so that the bright spot becomes a dark spot. The dark spot is invisible both in a display mode and a non-display mode. It is understood that the dark spots are usually sub-pixel level or pixel level spots. When the OLED display panel 1 displays, the dark spots are too small to be noticed by human eyes, so there are no display abnormalities.

Further, a wavelength of the laser light can specifically be 1000 nm, 1064 nm, or 1100 nms.

It can be understood that, for example, when the wavelength of the laser light is 1000 nm, by setting a laser light source 2 with a wavelength of 1000 nm to illuminate the OLED display panel 1, the laser light emitted by the laser light source 2 can effectively pass through the filter pattern, and the light transmission rate of the filter pattern can reach more than 95%. The laser light can reach a red light-emitting pattern 301, a blue light-emitting pattern 303, and a green light-emitting pattern 302 that need to be repaired to repair the bright spots. When the filter pattern have a higher light transmission rate for the laser light, the repair yield is higher. Similarly, when the laser wavelength is 1064 nm and 1100 nm, the light transmission rate of the filter pattern for the laser can also be more than 95%.

It is understood that the red filter pattern 501, the blue filter pattern 503, and the green filter pattern 502 have different transmission rates for a visible light band. That is to say, the red filter pattern 501 has the highest light transmission rate for a red-light wavelength band. The blue filter pattern 503 has the highest light transmission rate for a blue-light wavelength band, and the green filter pattern 502 has the highest light transmission rate for a green-light wavelength band. However, for the wavelength range of 900 to 1200 nm, the red filter pattern 501, the blue filter pattern 503, and the green filter pattern 502 all have the light transmission rate of greater than 90%.

It should be noted that the wavelength range of the laser light cannot be the visible light wavelength range. For example, when the wavelength range of the laser light is the red-light wavelength range, the filter pattern has an increased light transmission rate for the red light, and the filter pattern cannot block the red light of ambient light. The ambient light has a great influence on the green light and blue light emitted by the light-emitting functional layer 30, resulting in display abnormalities.

It should be noted that the present application uses the laser light source in the infrared light band to perform laser repair. By improving the light transmission rate of the filter pattern of the color filter layer 50 for the laser light in the infrared light band, laser repair yield is improved. Only the light transmission rate in the infrared light band is changed, and the light transmission rate for visible light such as the red light, the blue light, and the green light are not affected. Accordingly, the normal display functions of the OLED display panel 1 are not affected.

Further, the wavelength range of the laser light in the present application is 1000 nm to 1100 nm. It can be understood that the wavelength range of the red light is 647 nm to 760 nm, and the wavelength range of the green light is 510 nm to 550 nm. The wavelength of the blue light ranges from 430 nm to 455 nm. When the laser wavelength is more than 1000 nm, a difference between the laser wavelength and the maximum red-light wavelength is greater than 200 nm. Therefore, changes on the light transmission rate of the filter pattern for the laser light have a smaller impact on the visible light, thus further reducing the influence on the light transmission rate of the visible light band by changing the light transmission rate for the laser wavelength from 1000 nm to 1100 nm.

In the present embodiment, when the wavelength range of the laser light is from 1000 nm to 1100 nm, the laser light with this wavelength band can be easily obtained in a manufacturing process, and can be better distinguished from the red-light, green-light, and blue-light wavelength bands. Accordingly, the present application prevents the filter pattern from affecting the light transmission rate of the filter pattern for the red light, green light, and blue light, and resulting in poor display performance of the OLED display panel 1.

In one embodiment, the color filter layer 50 comprises a first filter pattern, a second filter pattern, and a third filter pattern. The light-emitting functional layer 30 comprises a red light-emitting pattern 301, a green light-emitting pattern 302, and a blue light-emitting pattern 303. The first filter pattern is aligned with the red light-emitting pattern 301, the second filter pattern is aligned with the green light-emitting pattern 302, and the third filter pattern is aligned with the blue light-emitting patterns 303.

In one embodiment, the light transmission rate of the first filter pattern is greater for the red light than for the blue/green light, and the light transmission rate of the second filter pattern is greater for the green light than for the red/blue light. The light transmission rate of the third filter pattern is greater for the blue light than for red/green light.

In one embodiment, any two of the first filter pattern, the second filter pattern, and the third filter pattern have a light transmission rate difference ΔT of less than 20% for the laser light having the wavelength range from 760 nm to 1200 nm.

Wherein, the light transmission rate of the filter pattern for the laser light with the wavelength from 900 to 1200 nanometers is greater than 90%, and the light transmission rate of the filter pattern for the visible light with peak values from 430 nm to 760 nm can be 75%+5%.

In the present embodiment, the light transmission rate of the filter pattern for the laser light from 900 nm to 1200 nm is greater than the light transmission rate for the peak values of the visible light band. Therefore, the repair effect is better by using the infrared light as the laser light than the repair effect by using the visible light as the laser light.

In one embodiment, a full width at half maximum (FWHM) of the third filter pattern for a laser transmission spectrum from 430 nm to 760 nm is greater than the FWHM of the second filter pattern for the laser transmission spectrum from 430 nanometers to 760 nanometers.

Further, when the wavelength range of the laser light is 900 nm to 1200 nm, the ΔT is less than 5%.

In the present embodiment, the first filter pattern, the second filter pattern, and the third filter pattern have a small light transmission rate difference ΔT when the wavelength range of the laser light is from 760 nm to 1200 nm, thereby improving the similarity of the materials in the filter patterns affecting an infrared light transmission rate, and consequently, reducing production costs of producing the first filter pattern, the second filter pattern, and the third filter pattern.

In one embodiment, the light transmission rate of the filter pattern for the laser light from 900 nm to 1200 nm is greater than the light transmission rate of the filter pattern for peak values from 430 nm to 760 nm.

In the present embodiment, the high light transmission rate of the third filter pattern covers a wider wavelength range, has higher sensitivity, and can reflect light of a larger wavelength range, thus further enhancing light output efficiency.

In one embodiment, when the wavelength range of the laser light is 647 nm to 760 nm, the light transmission rate of the first filter pattern for the laser light ranges from 60% to 80%.

Wherein, a peak value corresponding to the first filter pattern is 650 nm in the laser transmission spectrum from 647 nanometers to 760 nanometers.

The first filter pattern is a red filter pattern 501, which is arranged corresponding to the red light-emitting pattern 301, and is used to block light other than the red light in the ambient light from entering the red light-emitting pattern 301 in the plane.

Wherein, the red light in the ambient light can pass through the red filter pattern 501 and be incident into the plane, and through the total reflection by an anode reflective layer, enhance the light output effect of the red light.

It can be understood that the red filter pattern 501 has a low light transmission rate for the green light and the blue light, and has the light transmission rate of 60% to 80% for only the red light.

In the present embodiment, the red filter pattern 501 needs to have the light transmission rate of greater than 60% for the red light to ensure the red light output efficiency and reduce the influence of the ambient light on the red light emission. At the same time, the anode reflective layer is used to achieve the total reflection of the red light to further enhance the light output efficiency of the red light.

In one embodiment, when the wavelength range of the laser light is from 510 nm to 550 nm, the light transmission rate of the second filter pattern ranges from 60% to 80% for the laser light.

A peak value corresponding to the second filter pattern is 527 nm in the laser transmission spectrum from 510 nm to 550 nm, and the FWHM corresponding to the second filter pattern is 80 nm in the laser transmission spectrum from 510 nm to 550 nm.

The first filter pattern is a green filter pattern 502, which is arranged corresponding to the green light-emitting pattern 302, and is used to block light other than the green light in the ambient light from entering the green light-emitting pattern 302 in the plane.

Wherein, the green light in the ambient light can pass through the green filter pattern 502 and be incident into the plane, and through the total reflection by the anode reflective layer, enhance the light output effect of the green light.

It can be understood that the green filter pattern 501 has a low light transmission rate for the red light and the blue light, and has the light transmission rate of 60% to 80% for only the green light.

In the present embodiment, the green filter pattern 501 needs to have the light transmission rate of greater than 60% for the green light to ensure the green light output efficiency and reduce the influence of the ambient light on the green light emission. At the same time, the anode reflective layer is used to achieve the total reflection of the green light to further enhance the light output efficiency of the green light.

In one embodiment, when the wavelength range of the laser light is from 430 nm to 470 nm, the light transmission rate of the third filter pattern ranges from 60% to 80% for the laser light.

A peak value corresponding to the third filter pattern is 460 nm in the laser transmission spectrum from 430 nm to 470 nm, and the FWHM corresponding to the third filter pattern is 90 nm in the laser transmission spectrum from 430 nm to 470 nm.

The first filter pattern is a blue filter pattern 503, which is arranged corresponding to the blue light-emitting pattern 303, and is used to block light other than the blue light in the ambient light from entering the blue light-emitting pattern 302 in the plane.

Wherein, the blue light in the ambient light can pass through the blue filter pattern 501 and be incident into the plane, and through the total reflection by the anode reflective layer, enhance the light output effect of the blue light.

It can be understood that the blue filter pattern 503 has a low light transmission rate for the red light and the green light, and has the light transmission rate of 60% to 80% for only the blue light.

In the present embodiment, the blue filter pattern 503 needs to have the light transmission rate of greater than 60% for the blue light to ensure the blue light output efficiency and reduce the influence of the ambient light on the blue light emission. At the same time, the anode reflective layer is used to achieve the total reflection of the blue light to further enhance the light output efficiency of the blue light.

In some embodiments, beside changing materials for producing the filter patterns, thicknesses or shapes of the red filter pattern 501, the green filter pattern 502, and the blue filter pattern 503 can also be changed to improve the laser repair yield.

The light transmission rates can be improved by reducing the thicknesses of the red filter pattern 501, the green filter pattern 502, and the blue filter pattern 503.

The laser repair yield can also be improved by changing the shapes of the red filter pattern 501, the green filter pattern 502, and the blue filter pattern 503. By converging the laser light for repairing, the laser light has an increased light intensity when reaching the bright spots through the red filter pattern 501, the green filter pattern 502, and the blue filter pattern 503 above, thereby increasing the laser repair yield.

In one embodiment, the thickness of the filter pattern can be reduced to increase the light transmission rate of the filter pattern for light with a specific wavelength band.

Wherein, the specific wavelength band can be the wavelength range of the laser light from 900 nm to 1200 nm.

It can be understood that if the thickness of the filter pattern is reduced, the light transmission rate will be increased accordingly. According to the required light transmission rate, the thickness of each filter pattern can be adjusted to satisfy the requirement for the light transmission rate for the laser light. For example, the thickness of the filter pattern is adjusted to a first preset value, such that the light transmission rate is greater than 90% for the laser light with the wavelength range of 900 nm to 1000 nm and 1100 nm to 1200 nm. In another example, the thickness of the filter pattern is adjusted to a second preset value, such that the light transmission rate is greater than 95% for the laser light with the wavelength range of 1000 nm to 1100 nm.

It should be noted that the film thicknesses of the first filter pattern, the second filter pattern, and the third filter pattern can be different. Specifically, according to actual needs, the light transmission rates for the red light, the green light, and the blue light are adjusted adaptively.

In the present embodiment, by reducing the thickness of the filter pattern, the light transmission rate of the filter pattern for the laser light is increased, thereby increasing the laser repair yield for the bright spot.

In one embodiment, an upper surface of the filter pattern can be a light-convergence surface or a light-convergence member above the filter pattern to increase the light intensity of the light passing through the filter pattern, thereby increasing the laser repair yield.

The laser repair yield is related to laser energy reaching the bright spot of the light-emitting layer. When the light transmission rate of the filter pattern remains unchanged, the light intensity can be increased to improve the laser repair yield.

In the present embodiment, the surface of the filter pattern is a light-convergence surface or a light-convergence member is disposed above the filter pattern, so that more light can pass through the filter pattern to increase the light intensity of the laser light reaching the light-emitting layer, thus improving the laser repair yield.

In one embodiment, the material for producing the filter pattern further comprises a visible light inhibitor, which can reduce the light transmission rate of the filter pattern for the visible light.

The visible light inhibitor comprises at least a red light inhibitor, a green light inhibitor, and a blue light inhibitor. The red light inhibitor can reduce the light transmission rate of the red light, the green light inhibitor can reduce the light transmission rate of the green light, and the blue light inhibitor can reduce the light transmission rate of the blue light.

Wherein, the red filter pattern 501 comprises at least the green light inhibitor and the blue light inhibitor.

Wherein, the green filter pattern 502 includes at least the red light inhibitor and the blue light inhibitor.

Wherein, the blue filter pattern 503 includes at least the red light inhibitor and the green light inhibitor.

It can be understood that the light transmission rates of the red filter pattern 501, the green filter pattern 502, and the blue filter pattern 503 can be improved by changing the thicknesses and shapes, but at the same time, the light transmission rate of the visible light band is affected. For example, the red filter pattern 501 have an increased light transmission rate for the blue light and the green light. As a result, the blue and green light in the ambient light have increased influence on the red filter pattern 501, causing the display abnormalities.

In the present embodiment, the filter patterns further comprise a visible light inhibitor, which reduces the light transmission rates of the filter patterns for color light with the three primary colors (red, green, and blue), thereby meeting the needs of the OLED display panel 1 for normal display operations.

Figure 5:
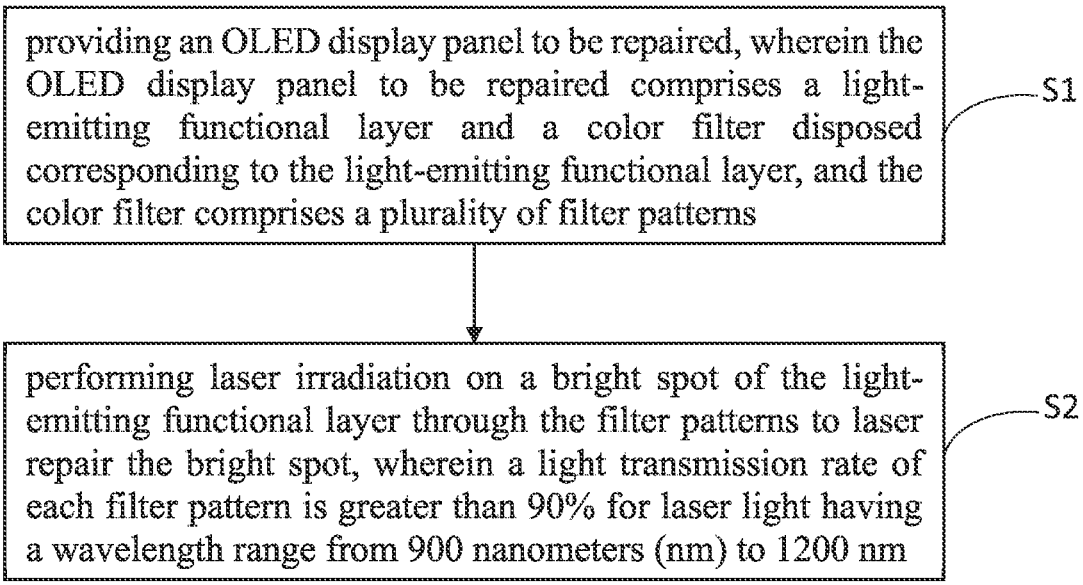
FIG. 5 is a process flow diagram of the laser repair method according to the present application.

Referring to FIG. 5, the present application provides a laser repair method for an OLED display panel 1, comprising:

S1: providing an OLED display panel to be repaired, wherein the OLED display panel to be repaired comprises a light-emitting functional layer and a color filter disposed corresponding to the light-emitting functional layer, and the color filter comprises a plurality of filter patterns;

S2: performing laser irradiation on a bright spot of the light-emitting functional layer through the filter patterns to laser repair the bright spot to obtain the OLED display panel 1 of any of the above embodiments, wherein a light transmission rate of each filter pattern is greater than 90% for laser light having a wavelength range from 900 nanometers (nm) to 1200 nm.

In the step of performing laser irradiation, the laser light has the wavelength range from 1000 nm to 1100 nm, and each filter pattern has the light transmission rate of greater than 95% for the laser light having the wavelength range from 1000 nm to 1100 nm.

In one embodiment, the step of irradiating the OLED display panel 1 with the laser light through the color filter layer 50 to perform laser repairing further comprises: providing at least one laser light source 2, and using the laser light source 2 to irradiate an area of the bright spot of the light-emitting layer from one side of the color filter layer 50 to repair the bright spot.

In one embodiment, the step of irradiating the OLED display panel 1 with the laser light through the color filter layer 50 to perform laser repairing further comprises: emitting the laser light with a wavelength of 1000 nm from the laser light source 2 to pass through the filter patterns to repair the bright spots of the light-emitting layer.

It can be understood that the wavelength of the laser light can also be 1064 nm or 1100 nm. The laser light source 2 adjustable in a certain wavelength range can be used. The wavelength adjustment range of the laser light source 2 can be from 900 nm to 1200 nm or from 1000 nm to 1100 nm.

It should be noted that the laser light source 2 can also have other wavelength adjustment ranges, and the wavelength adjustment range needs to include at least one of wavelengths of 1000 nm. 1064 nm, and 1100 nm.

Figure 6:
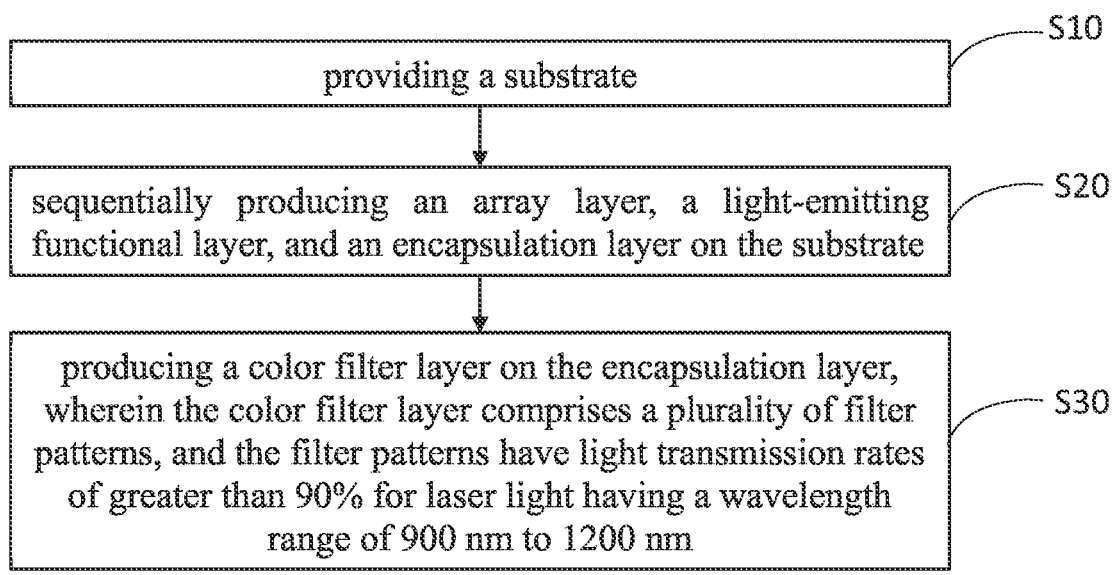
FIG. 6 is a process flow diagram of a manufacturing method of the OLED display panel according to the present application.

Referring to FIG. 6, the present application provides a manufacturing method of an OLED display panel 1, comprising:

S10: providing a substrate 10;

S20: sequentially producing an array layer 20, a light-emitting functional layer 30, and an encapsulation layer 40 on the substrate 10;

S30: producing a color filter layer 50 on the encapsulation layer 40, wherein the color filter layer 50 comprises a plurality of filter patterns, and the filter patterns have light transmission rates of greater than 90% for laser light having a wavelength range of 900 nm to 1200 nm.

Wherein, the filter patterns comprise a red filter pattern 501, a blue filter pattern 503, and a green filter pattern 502.

Wherein, when the wavelength range of the laser light is from 1000 nm to 1100 nm, the light transmission rates of the filter patterns are greater than 95% for the laser light.

The present application also provides a display module and a display device, wherein the display module comprises the OLED display panel 1 described in any of the above embodiments, and also comprises a back frame, a middle frame, and a cover arranged on two sides of the OLED display panel. The display device comprises the above-mentioned OLED display panel 1, and a detailed description is not repeated here.

The OLED display panel of the present application comprises a substrate, an array layer, a light-emitting functional layer, an encapsulation layer, and a color filter layer. The array layer is disposed on the substrate. The light-emitting functional layer is disposed on the array layer, the light-emitting functional layer comprises a plurality of light-emitting patterns, the encapsulation layer is disposed on the light-emitting functional layer, and the color filter layer is disposed on the encapsulation layer. The color filter layer comprises a plurality of filter patterns and a plurality of black matrixes spaced apart from each other. Each filter pattern is arranged in alignment with one of the light-emitting patterns. At least one of the light-emitting patterns comprises a carbonized light-emitting material, the carbonized light-emitting material comprises at least carbon black, and the carbonized light-emitting material has a carbon content greater than 50%. The laser repair method provided by the present application repairs the bright spot by the laser light passing through the filter patterns to reach the bright spot of the light-emitting layer, so that the light-emitting material at the bright spot is turned into a light-emitting material containing carbon black. The wavelength range of the laser light is from 900 nm to 1200 nm. By increasing the light transmission rate of the filter pattern for the laser light having the wavelength range of 900 nm to 1200 nm, the laser repair method has an increased laser repair yield.

The above describes in detail an OLED display panel and a laser repair method of the present application. Specific examples are used in the present disclosure to illustrate the working principles and embodiments of the present application. The description of the above embodiments is only for ease of understanding the methods and main ideas of the present application. According to the ideas of the present application, those skilled in the art can change the embodiments and protection scope of the present application. In summary, the content of the present specification should be a limitation to the present application.

What is claimed is:

1. An organic light-emitting diode (OLED) display panel, comprising:
    a substrate;
    an array layer disposed on the substrate;
    a light-emitting functional layer disposed above the array layer and comprising a plurality of light-emitting patterns;
    a color filter layer comprising a plurality of filter patterns and a plurality of black matrixes spaced from each other, wherein each filter pattern is arranged in alignment with one of the light-emitting patterns;
    wherein at least one of the light-emitting patterns comprises a carbonized light-emitting material, the carbonized light-emitting material comprises at least carbon black, and a carbon content of the carbonized light-emitting material is greater than 50%.

2. The OLED display panel according to claim 1, wherein a light transmission rate of each filter pattern is greater than 90% for laser light having a wavelength range from 900 nanometers (nm) to 1200 nm.

3. The OLED display panel according to claim 1, wherein a light transmission rate of each filter pattern has greater than 95% for the laser light having the wavelength range from 1000 nm to 1100 nm.

4. The OLED display panel according to claim 1, wherein any two of the first filter pattern, the second filter pattern, and the third filter pattern have a light transmission rate difference ΔT of less than 20% for the laser light having the wavelength range from 760 nm to 1200 nm.

5. The OLED display panel according to claim 4, wherein any two of the first filter pattern, the second filter pattern, and the third filter pattern have a laser transmission difference ΔT of less than 5% for the laser light having the wavelength range from 1000 nm to 1100 nm.

6. The OLED display panel according to claim 1, wherein a full width at half maximum (FWHM) of the third filter pattern for a laser transmission spectrum from 430 nm to 760 nm is greater than the FWHM of the second filter pattern for the laser transmission spectrum from 430 nm to 760 nm.

7. The OLED display panel according to claim 6, wherein when the wavelength range of the laser light is from 510 nm to 550 nm, the light transmission rate of the second filter pattern ranges from 60% to 80%.

8. The OLED display panel according to claim 7, wherein a peak value corresponding to the second filter pattern is 527 nm in the laser transmission spectrum from 510 nm to 550 nm, and the FWHM corresponding to the second filter pattern is 80 nm in the laser transmission spectrum from 510 nm to 550 nm.

9. The OLED display panel according to claim 6, wherein when the laser light has the wavelength range from 430 nm to 470 nm, the light transmission rate of the third filter pattern ranges from 60% to 80%.

10. The OLED display panel according to claim 9, wherein the peak value corresponding to the third filter pattern is 460 nm in the laser transmission spectrum from 430 nm to 470 nm, and the FWHM corresponding to the third filter pattern is 90 nm in the laser transmission spectrum from 430 nm to 470 nm.

11. The OLED display panel according to claim 6, wherein when the laser light has the wavelength range from 647 nm to 760 nm, the light transmission rate of the first filter pattern ranges from 60% to 80%.

12. The OLED display panel according to claim 1, wherein the light transmission rate of each filter pattern for the laser light having the wavelength range of 900 nm to 1200 nm is greater than the light transmission rate of each filter pattern for the laser light having the peak wavelength of 430 nm to 760 nm.

13. The OLED display panel according to claim 12, wherein the color filter layer comprises a first filter pattern, a second filter pattern, and a third filter pattern, the light-emitting functional layer comprises a red light-emitting pattern, a green light-emitting pattern, and a blue light-emitting pattern, the first filter pattern and the red light-emitting pattern are arranged in alignment, the second filter pattern and the green light-emitting pattern are arranged in alignment, the third filter pattern and the blue light-emitting pattern are arranged in alignment.

14. The OLED display panel according to claim 13, wherein the first filter pattern has a greater light transmission rate for red light than for the blue light and green light, the second filter pattern has a greater light transmission rate for the green light than for the red light and the blue light, and the third filter pattern has a greater light transmission rate for the blue light than for the red light and the green light.

15. The OLED display panel according to claim 13, wherein the first filter pattern, the second filter pattern, and the third filter pattern have different film thicknesses.

16. The OLED display panel according to claim 2, wherein the OLED display panel comprises a display region and a non-display region, the non-display region is provided with an organic groove, the organic groove passes through at least the array layer.

17. The OLED display panel according to claim 16, wherein the organic groove is filled with an organic material.

18. The OLED display panel according to claim 17, wherein the organic material in the organic groove is same as a material of a planarization layer.

\* \* \* \* \*